US008729585B2

(12) United States Patent
Yoshimura et al.

(10) Patent No.: US 8,729,585 B2
(45) Date of Patent: May 20, 2014

(54) SEMICONDUCTOR LIGHT EMITTING DEVICE

(75) Inventors: Kimitaka Yoshimura, Fukuoka-ken (JP); Katsuhiko Nishitani, Fukuoka-ken (JP); Akihiro Fujiwara, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 13/421,817

(22) Filed: Mar. 15, 2012

(65) Prior Publication Data
US 2013/0015481 A1    Jan. 17, 2013

(30) Foreign Application Priority Data

Jul. 14, 2011  (JP) .................................. 2011-155451

(51) Int. Cl.
*H01L 33/00* (2010.01)
*H01L 33/22* (2010.01)

(52) U.S. Cl.
CPC ........................................ *H01L 33/22* (2013.01)
USPC .................... 257/98; 257/E33.074; 438/29

(58) Field of Classification Search
CPC ............................ H01L 33/007; H01L 33/22
USPC ................................ 257/98, E33.074; 438/29
See application file for complete search history.

(56) References Cited

U.S. PATENT DOCUMENTS

2009/0026468 A1 *   1/2009  Sakai et al. ..................... 257/88
2010/0140647 A1     6/2010  Joung

FOREIGN PATENT DOCUMENTS

JP    2010-141331    6/2010

* cited by examiner

*Primary Examiner* — Julio J Maldonado
*Assistant Examiner* — Daniel Shook
(74) *Attorney, Agent, or Firm* — Patterson & Sheridan, LLP

(57) ABSTRACT

According to one embodiment, in a semiconductor light emitting device, a substrate includes a first surface, a second surface opposite to the first surface, lateral surfaces intersected with the first surface and the second surface, first regions each provided on the lateral surface, and second regions each provided on the lateral surface. Each of the first regions has a first width and a first roughness. Each of the second regions has a second width smaller than the first width and a second roughness smaller than the first roughness. The first regions and the second regions are alternately arranged. A proportion of the sum of the first widths to a distance between the first surface and the second surface is 0.5 or more. A semiconductor laminated body is provided above the first surface of the substrate, and includes a first semiconductor layer, an active layer and a second semiconductor layer.

20 Claims, 10 Drawing Sheets

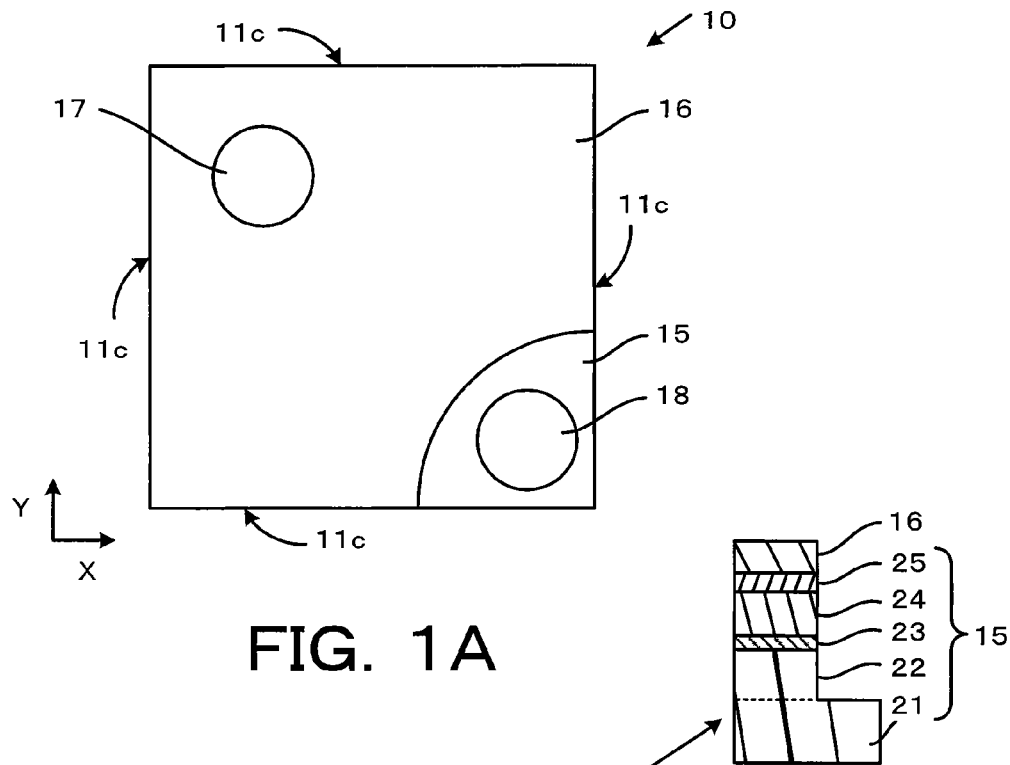
FIG. 1A
FIG. 1C
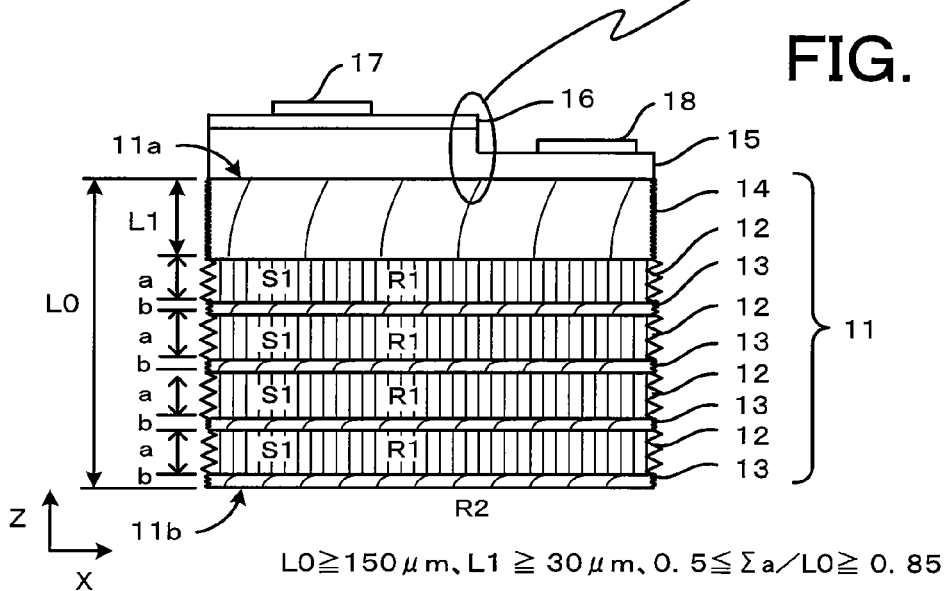
$L0 \geqq 150 \mu m, L1 \geqq 30 \mu m, 0.5 \leqq \Sigma a/L0 \geqq 0.85$
FIG. 1B

SEMICONDUCTOR LIGHT EMITTING DEVICE

CROSS REFERENCE TO RELATED APPLICATION

This application is based upon and claims the benefit of priority from the prior Japanese Patent Application No. 2011-155451, filed on Jul. 14, 2011, the entire contents of which are incorporated herein by reference.

FIELD

Embodiments described herein relate generally to a semiconductor light emitting device.

BACKGROUND

There have conventionally been provided nitride semiconductor light emitting devices in each of which a nitride semiconductor laminate body is formed on a C-plane sapphire substrate, and light is extracted not only from the nitride semiconductor laminate body but also from a lateral surface of the sapphire substrate.

In order to improve light extraction efficiency from a lateral surface of the sapphire substrate, the above-described nitride semiconductor light emitting device needs to have the sapphire substrate with a certain thickness and a roughened lateral surface.

The C-plane sapphire substrate, however, has no cleavage plane perpendicular to the C-plane, and is made of a material with high hardness and chemical stability. These properties make it difficult to divide the thick sapphire substrate into chips and to roughen the lateral surface of the sapphire substrate.

When a sapphire substrate is divided by point-scribing first and then breaking, the division begins at a point only approximately 10 μm deep from the surface of sapphire substrate. Accordingly, the thickness of the sapphire substrate needs to be within approximately 100 μm.

When a sapphire substrate is divided into chips by firstly performing an ablation process with a laser beam focused on a surface of the sapphire substrate and then by breaking, the division begins at a position only approximately 30 μm deep from the surface of a sapphire substrate. For this reason, the thickness of the sapphire substrate needs to be within approximately 130 μm.

After the sapphire substrate is divided into chips by breaking, each chip thus formed has lateral surfaces in a cracked state. For this reason, there is a problem that it is difficult to roughen such lateral surfaces.

BRIEF DESCRIPTION OF THE DRAWINGS

FIGS. 1A to 1C are diagrams showing a semiconductor light emitting device according to an embodiment;

DETAILED DESCRIPTION

Figure 2:
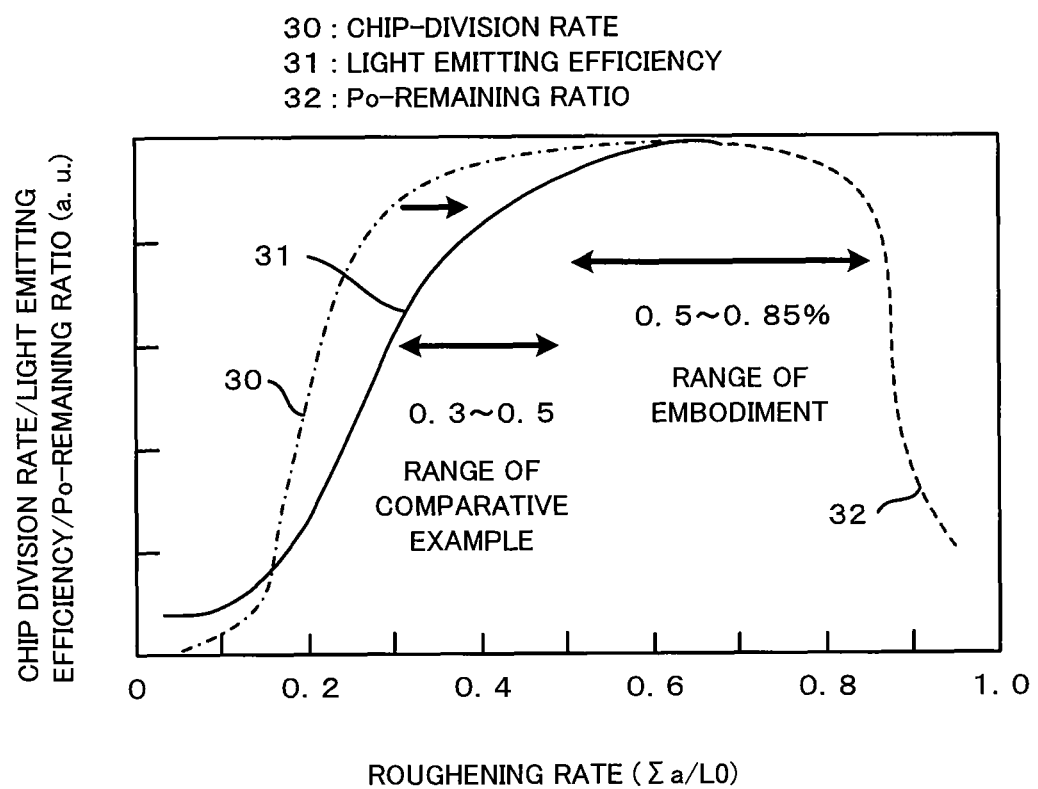
FIG. 2 is a conceptual chart showing characteristics of the semiconductor light emitting device according to the embodiment.

According to one embodiment, in a semiconductor light emitting device, a substrate includes a first surface, a second surface opposite to the first surface, a plurality of lateral surfaces intersected with the first surface and the second surface, a plurality of first regions each provided on the lateral surface, and a plurality of second regions each provided on the lateral surface. Each of the first regions has a first width and a first roughness. Each of the second regions has a second width smaller than the first width and a second roughness smaller than the first roughness. The first regions and the second regions are alternately arranged. A proportion of the sum of the first widths to a distance between the first surface and the second surface is 0.5 or more. A semiconductor laminated body provided above the first surface of the substrate, and includes a first semiconductor layer of a first conductivity type, an active layer, and a second semiconductor layer of a second conductivity type which are stacked one upon another in this order.

Hereinafter, embodiments will be described with reference to the drawings. In the drawings, same reference characters denote the same or similar portions.

Embodiment

A semiconductor light emitting device of an embodiment will be described with reference to FIGS. 1A to 1C. The semiconductor light emitting device of the embodiment is a nitride semiconductor light emitting device. FIGS. 1A to 1C are diagrams showing the nitride semiconductor light emitting device. FIG. 1A is a top plan view, FIG. 1B is a lateral view, and FIG. 1C is a sectional view showing a main portion of FIG. 1B.

As shown in FIGS. 1A to 1C, a nitride semiconductor light emitting device 10 of the embodiment includes a sapphire substrate 11. The sapphire substrate 11 has a first surface 11a and a second surface 11b that are opposite to each other. The sapphire substrate 11 also has four lateral surfaces 11c each of which is intersected with the first and the second surfaces 11a, 11b. Each of the lateral surfaces is substantially perpendicular to the first and the second surfaces 11a, 11b, for example. The sapphire substrate 11 has a shape of a rectangular solid with 250 μm×250 μm square surfaces and a thickness (L0) of approximately 200 μm, for example.

A layered structure is observed in each of the lateral surfaces 11c of the sapphire substrate 11. The layered structure includes four sets of first regions 12 and second regions 13 provided alternately from a position away from the first surface 11a by a first distance L1 (e.g. approximately 30 μm) towards the second surface 11b (i.e. in the −Z direction of the drawing). Each first region 12 differs from each second region 13 in roughness and width.

In each set, the first region 12 has a first roughness R1 and a first width a. The second region 13 has a second roughness R2 that is smaller than the first roughness R1, and also has a second width b that is smaller than the first width a.

The first and second regions 12, 13 in each set are provided in a manner that the sum of the first width a and the second width b (i.e. a+b) is constant. To put it differently, the first regions 12 are repeatedly formed with a constant pitch, for example.

The second width b is larger than zero, but is not larger than half the first width a (i.e. 0<b≤a/2). The first width a is approximately 30 µm, for example whereas the second width b is approximately 10 µm, for example.

Each of the first and second regions 12, 13 extends in a direction parallel to the first surface 11a (i.e. in the X directions of the drawing) from a first end of one of the lateral surfaces 11c to a second end of the lateral surface 11c.

The proportion of the sum of the first width a (Σa) of all the first regions 12 to the distance L0 between the first surface 11a and the second surface 11b is set at approximately 0.6 (hereinafter, this proportion is also simply referred to as a roughening rate). This proportion is generally same as the proportion of the sum of the areas S1 (ΣS1) of all the first regions 12 to the area S0 of the lateral surface 11c.

A nitride semiconductor laminated body 15 is provided above the first surface 11a of the sapphire substrate 11, and includes an N-type (a first conductivity type) first nitride semiconductor layer, a nitride active layer and a P-type (a second conductivity type) second nitride semiconductor layer which are stacked in this order.

The first nitride semiconductor layer includes an N-type GaN layer 21 and an N-type GaN clad layer 22, for example. The nitride active layer includes a Multiple Quantum Well (MQW) layer 23, for example. The second nitride semiconductor layer includes a P-type GaN clad layer 24 and a P-type GaN contact layer 25, for example.

A transparent conductive film 16 is provided above the nitride semiconductor laminated body 15 to spread a current and prevent an electrode material from blocking light extracted from the p-type GaN contact layer 25 side. A first electrode (a P-side electrode) 17, for example, a gold (Au) film, is provided on a portion of the transparent conductive film 16.

A second electrode (an N-side electrode) 18, for example, a laminated films including titanium (Ti)/platinum (pt)/gold (Au), is provided on the exposed N-type GaN layer 21 by removing a portion of the nitride semiconductor laminated body 15.

The first electrode 17 and the second electrode 18 are provided along the diagonal line of the sapphire substrate 11 so as to face each other.

The first region 12 and the second region 13 are formed in the following manner. Firstly, a laser beam with a wavelength to which the sapphire is translucent is focused inside the sapphire substrate, and is moved relatively to the sapphire substrate in a discrete manner, e.g. at 5-µm intervals, along a line where the sapphire substrate is to be divided. Thus, affected layers are formed inside of the sapphire substrate.

The affected layers are re-solidified sapphire regions formed by the re-solidification of sapphire that has been melted by the energy of the laser light. The strength of the affected layers is impaired by the cracks or the like that are formed in the affected layers due to the thermal strain. The size of each affected layer thus formed depends on the shape and the output power of the laser beam, and other factors. An adequate distance of the relative movement of the laser beam is longer than the diameter of the laser beam but is not longer than twice the diameter of the laser beam.

When the sapphire substrate containing the affected layers formed inside is subjected to a breaking process, the cracks formed in the affected layers stretch towards the first and the second surfaces 11a and 11b, and thereby the sapphire substrate is divided into chips. The affected layers exposed with the division of the sapphire substrate are the first regions 12. The regions between two adjacent affected layers are the second regions 13.

Each first region 12 forms a lateral surface having asperities and corresponding to the size of the affected layer. Each first region 12 has the first roughness R1 and the first width a.

Each second region 13, on the other hand, forms a streaky lateral surface having asperities and corresponding to the cracks. Each second region 13 has the second roughness R2 that is smaller than the first roughness R1, and also has the second width b that is smaller than the first width a. The second width b corresponds to the pitch with which the affected layers are formed.

A third region 14 is formed between the first surface 11a of the sapphire substrate 11 and the uppermost first region 12. The third region 14 forms a crack-like lateral surface, and includes terrace-like flat surfaces. Hence, the roughness of the third region 14 is smaller than the second roughness R2.

The third region 14 is formed to prevent the damage done to the nitride semiconductor laminate body 15 by the heat caused by the laser beam focused in the sapphire substrate.

The nitride semiconductor laminated body 15 is briefly described below. The N-type GaN layer 21 is a base single crystal layer on which the N-type GaN clad layer 22 to P-type GaN contact layer 25 are grown, and formed in a thickness of approximately 3 µm for example. The N-type GaN clad layer 22 is formed in a thickness of approximately 2 µm, for example.

The MQW structure 23 is formed in such a multiple quantum well structure that a GaN barrier layer with a thickness of approximately 5 nm and InGaN well layer with a thickness of approximately 2.5 nm are stacked alternately and the InGaN well layer is located at top layer, for example.

The P-type GaN clad layer 24 is formed in a thickness of approximately 100 nm, for example. The P-type GaN contact layer 25 is formed in a thickness of approximately 10 nm, for example.

A composition ratio x of In in each InGaN well layer (the $In_xGa_{1-x}N$ layer, 0<x<1) is set at approximately 0.1 for the purpose of making a peak light-emission wavelength equal to approximately 450 nm, for example.

The nitride semiconductor light-emitting device 10 described above is configured to improve light extraction efficiency from the lateral surfaces 11c by optimizing the thickness L0 of the sapphire substrate 11 and the roughening rate of the lateral surfaces 11c while the reliability is secured.

FIG. 2 is a conceptual chart showing the relationships among the roughening rate of the lateral surfaces of the sapphire substrate 11, the rate at which chips are divided (hereinafter, simply referred to as the "chip-division rate"), the light emitting efficiency, and the ratio of remaining initial output power of the light (hereinafter, simply referred to as the "Po-remaining ratio") in the nitride semiconductor light emitting device 10.

The horizontal axis of the graph shown in FIG. 2 represents the roughening rate. A dashed-dotted line 30 indicates the chip-division rate, a solid line 31 indicates the light emitting efficiency, and a broken line 32 indicates the Po-remaining ratio. The vertical axis is arbitrarily scaled, but the maximum value of the chip-division rate, the light emitting efficiency and the Po-remaining ratio are all at the same height.

In FIG. 2, the following tendencies can be observed concerning the chip-division rate. When the roughening rate is smaller than 0.3, the chip-division rate drops drastically. When the roughening rate is approximately 0.5, a chip-division rate that is substantially satisfactory can be obtained. When the roughening rate is larger than 0.5, the chip-division rate changes little.

Hence, in a comparative example, the roughening rate is set at a value between 0.3 and 0.5. This is because a larger roughening rate needs longer time and more cost for the laser dicing process.

In addition, the following tendencies can be observed concerning the light emitting efficiency. As the roughening rate becomes larger, the light emitting efficiency becomes higher. A particularly high light emitting efficiency is obtained when the roughening rate is 0.5 or more. This is because as the roughening rate becomes larger, the light incident on a lateral surface becomes more likely to be extracted from the lateral surface.

Moreover, the following tendencies can be observed concerning the Po-remaining ratio. As the roughening rate becomes larger than 0.85, the Po-remaining ratio drops drastically. This is because as the roughening rate becomes larger, it becomes difficult to secure the necessary first distance L1, and the nitride semiconductor laminate body 15 is thus thermally damaged when the laser beam is focused in the sapphire substrate.

Accordingly, to secure a certain level of reliability and to improve the light emitting efficiency, it is desirable to set the roughening rate at a value between 0.5 and 0.85.

Figure 3:
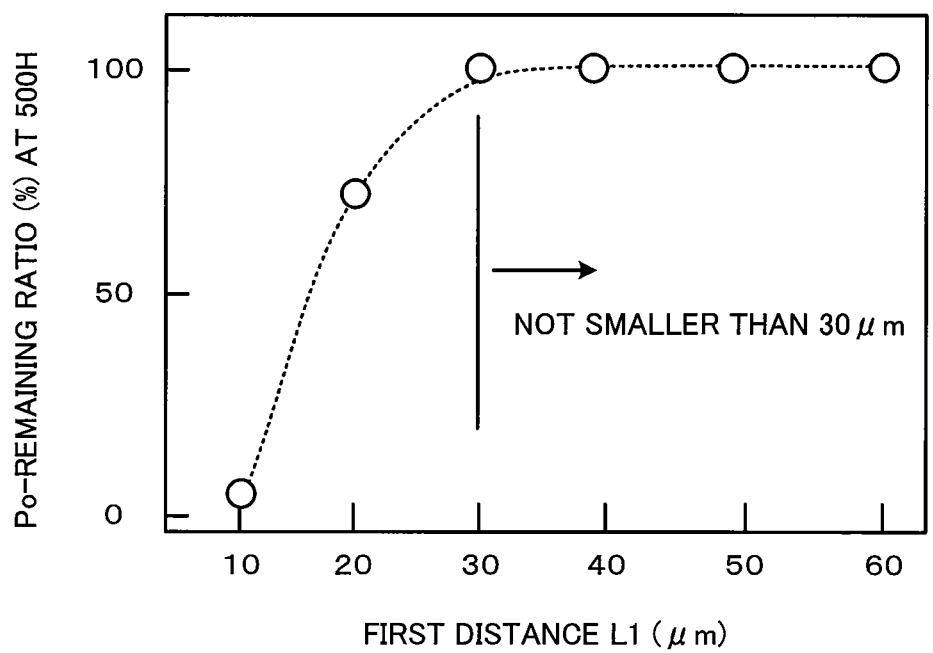
FIG. 3 is a chart showing the characteristic of the semiconductor light emitting device according to the embodiment.

Next, characteristics of the nitride semiconductor light emitting device 10 will be described with reference to FIGS. 3 to 6. FIG. 3 is a diagram showing the relationship between the first distance L1 and the Po-remaining ratio of the nitride semiconductor light emitting device 10. In FIG. 3, the horizontal axis represents the first distance L1. The vertical axis represents the Po-remaining ratio at 500 hours later. The values of Po-remaining ratio are normalized with the Po-remaining ratio obtained when the first distance L1 is 60 µm.

As shown in FIG. 3, the Po-remaining ratio is not larger than 10% when the first distance L1 is 10 µm, whereas the Po-remaining ratio is approximately 70% when the first distance L1 is 20 µm. As the first distance L1 becomes shorter, the Po-remaining ratio drops drastically.

When the first distance L1 is 30 µm or more, the Po-remaining ratio is approximately 100%. Accordingly, when the laser beam is focused in the sapphire substrate with a first distance L1 of 30 µm or more, the damage on the nitride semiconductor laminate body 15 can be avoided irrespective of the thickness of the sapphire substrate 11.

Figure 4:
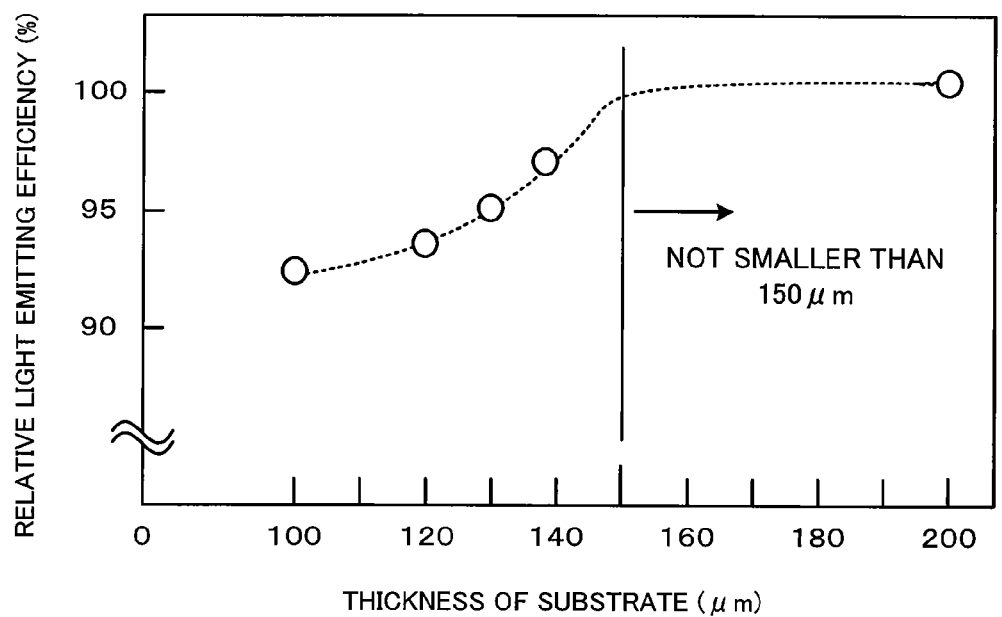
FIG. 4 is a chart showing the characteristic of the semiconductor light emitting device according to the embodiment.

FIG. 4 is a chart showing the relationship between the thickness L0 of the sapphire substrate 11 and the light emitting efficiency. In FIG. 4, the horizontal axis represents the thickness L0 of the sapphire substrate 11. The vertical axis represents the light emitting efficiency. The values of the light emitting efficiency are normalized with the light emitting efficiency obtained when the thickness L0 of the sapphire substrate 11 is 200 µm.

As shown in FIG. 4, the light emitting efficiency tends to become higher as the thickness L0 of the sapphire substrate 11 becomes larger. The light emitting efficiency, however, is saturated when the thickness L0 of the sapphire substrate 11 is 150 µm or more. To extract the light incident on a lateral surface of the sapphire substrate 11, the sapphire substrate 11 preferably has a certain thickness.

Figure 5A:
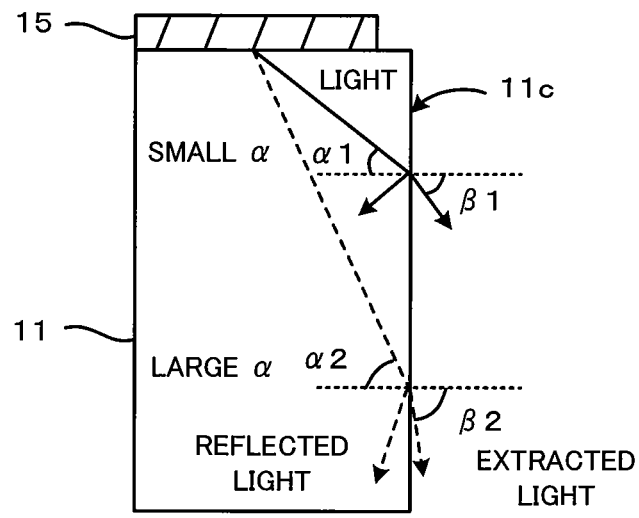
FIGS. 5A and 5B are charts showing characteristic of the semiconductor light emitting device according to the embodiment.
Figure 5B:
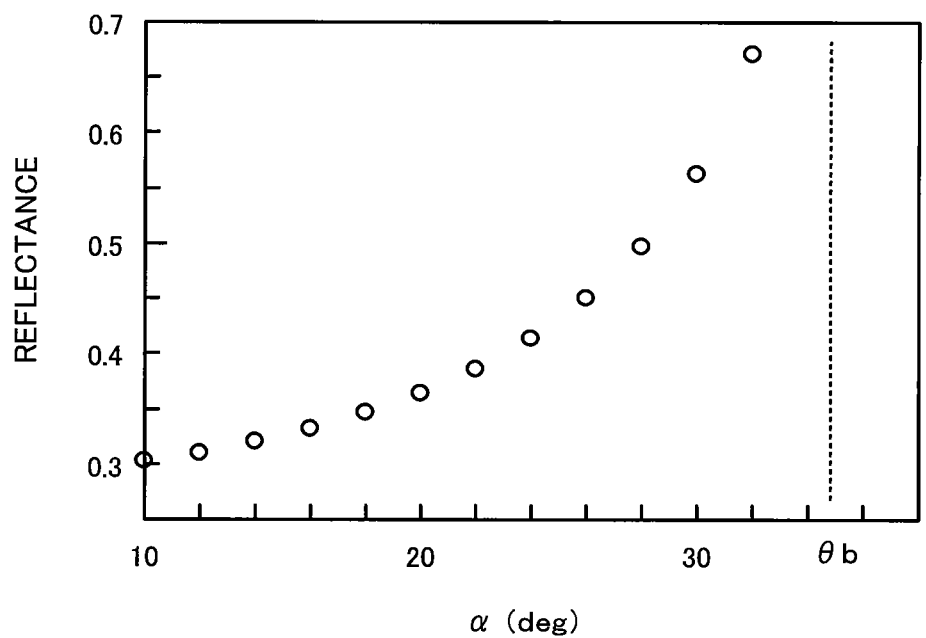

FIGS. 5A and 5B are diagrams to explain the reflection characteristics of the sapphire substrate 11. FIG. 5A is a diagram showing light paths. FIG. 5B is a diagram showing the values of reflectance. To get the reflectance, the dependence of the incidence angle $\alpha$ is calculated with the wavelength of the incident light being 410 nm and the refractive index of sapphire being 1.785.

As shown in FIGS. 5A and 5B, some portions of the light emitted from the nitride semiconductor laminate body 15 and made incident on the lateral surface 11c are reflected at the interface, but some other portions of the light pass through the interface. As the incidence angle $\alpha$ becomes larger, the reflected light becomes stronger. Accordingly, the outgoing light becomes weaker, and the outgoing angle $\beta$ becomes larger.

When the incidence angle $\alpha$ is equal to the total reflection angle $\theta b$ (=approximately 34.8°) of sapphire, the reflectance is one, and the outgoing angle $\beta$ is 90°. When the incidence angle $\alpha$ is zero (i.e. vertical incidence), the reflectance is approximately 0.079.

Figure 6:
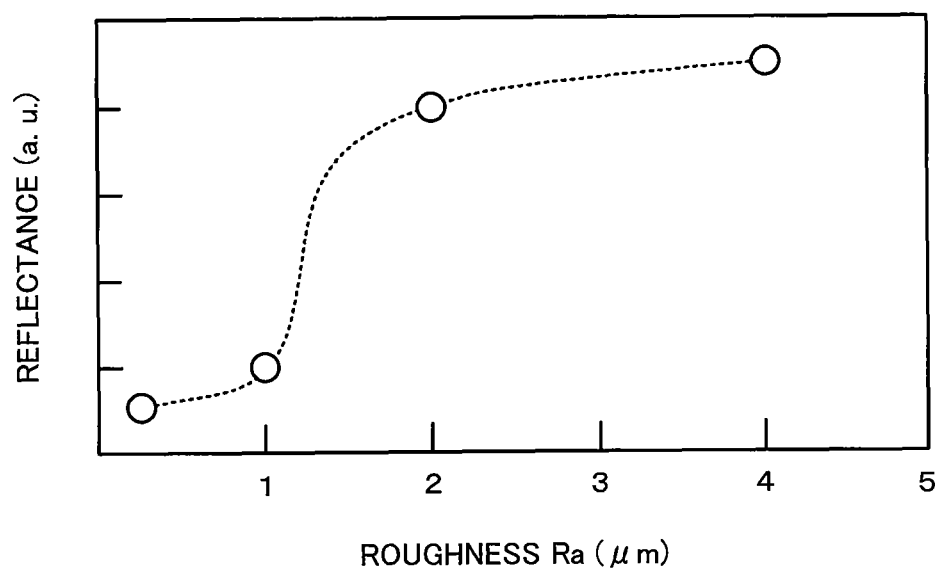
FIG. 6 is a chart showing characteristic of the semiconductor light emitting device according to the embodiment.

FIG. 6 is a chart showing the relationship between the roughness of the lateral surface 11c of the sapphire substrate 11 and the reflectance. To get the reflectance, the roughness dependence is calculated with the wavelength of the incident light being 410 nm, the refractive index of sapphire being approximately 1.785, and the incidence angle $\alpha$ being zero (i.e. vertical incidence). The roughness used in this calculation is the average surface roughness Ra.

As widely known, the average surface roughness Ra is a value calculated in the following way. Firstly, from the roughness curve, a standard length L is extracted in the direction of the average line of the roughness curve. Then, the X axis is set in the direction of the extracted section of the average line whereas the Y axis is set in the direction of the vertical magnification. When the roughness curve is expressed by use of an equation $y=f(x)$, the absolute value of $f(x)$ is integrated from zero to L. Then, the integral is divided by the length L, and the quotient thus obtained is expressed in micrometers (µm).

As shown in FIG. 6, as the roughness Ra becomes larger, the reflectance becomes larger. The reflectance starts increasing from a point where the roughness Ra exceeds 1 µm. The reflectance becomes saturated when the roughness Ra exceeds 2 µm.

As well known, the reflection mode differs depending upon the roughness Ra. When the roughness Ra is substantially equal to the wavelength, the light is scattered at the interface. When the roughness Ra is sufficiently larger than the wavelength, the light is diffusely reflected at the interface.

When the roughness Ra of the lateral surfaces 11c of the sapphire substrate 11 is substantially between the wavelength of and a value from one tenth to a half of the wavelength of the light emitted from the MQW layer 23 and propagated in the sapphire substrate 11, the refractive index at the interface between the sapphire substrate 11 and the air gradually varies equivalently. As a consequence, the total reflection in the sapphire substrate 11 can be reduced effectively.

For example, when the light extracted from the sapphire substrate 11 has a wavelength of 410 nm, because the refractive index in the sapphire substrate 11 is approximately 1.785, the light in the sapphire substrate 11 has a wavelength of approximately 230 nm. Hence, it is preferable to set the roughness Ra to approximately 0.23 µm or less, and is more preferable to set the roughness Ra to 0.05 µm or less.

When, in contrast, the roughness Ra of the lateral surfaces 11c of the sapphire substrate 11 is sufficiently larger than the wavelength of the light emitted from the MQW layer 23 and propagated in the sapphire substrate 11, the light is diffusely reflected at the interface between the sapphire substrate 11 and the air.

As the reflectance becomes lower, the transmittance is improved and the light extraction efficiency is also improved. Hence, it is preferable that the roughness Ra of the lateral surface 11c of the sapphire substrate 11 be substantially equal to the wavelength. Even when the roughness Ra is larger than the wavelength, a certain effect can be expected.

Figure 7:
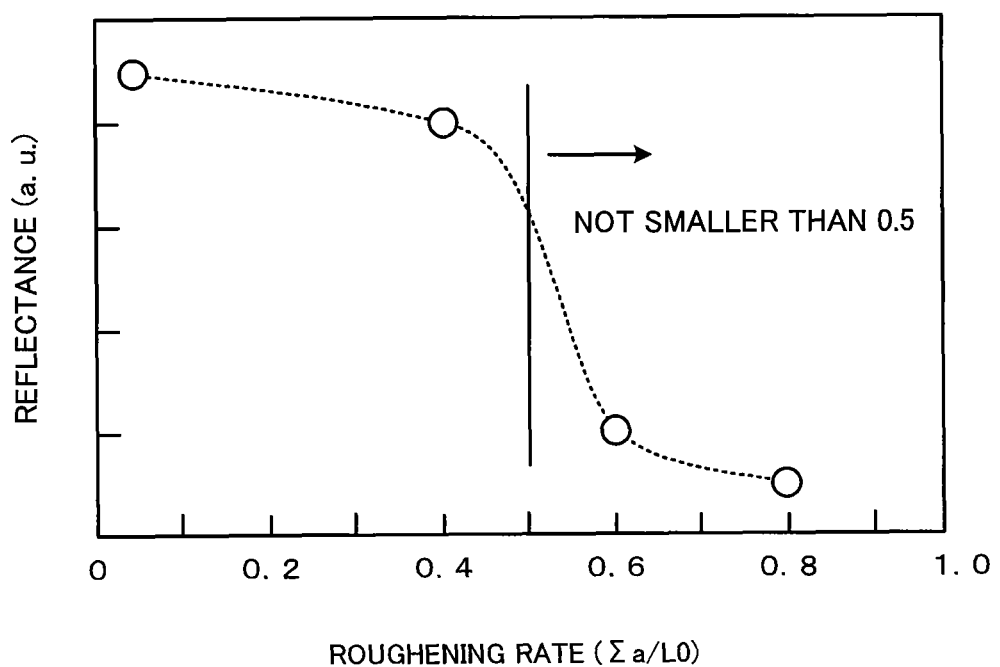
FIG. 7 is a chart showing the characteristic of the semiconductor light emitting device according to the embodiment.

FIG. 7 is a chart showing the relationship between the roughening rate and the reflectance. The above-mentioned reflectance is obtained by calculating the average reflectance of the lateral surfaces 11c at the time when light enters the entire lateral surfaces 11c of the sapphire substrate 11.

As shown in FIG. 7, when the roughening rate exceeds 0.5, the reflectance tends to drop drastically. As the reflectance becomes lower, the transmittance is improved and the light extraction efficiency is also improved. Hence, it is preferable that the roughening rate of the lateral surfaces 11c of the sapphire substrate 11 be 0.5 or more.

Accordingly, as long as the roughening rate of the lateral surfaces 11c of the sapphire substrate 11 is not smaller than 0.5 but is not larger than 0.85, light extraction efficiency for the light outputted from the lateral surface 11c can be improved without sacrificing the reliability.

Figure 8:
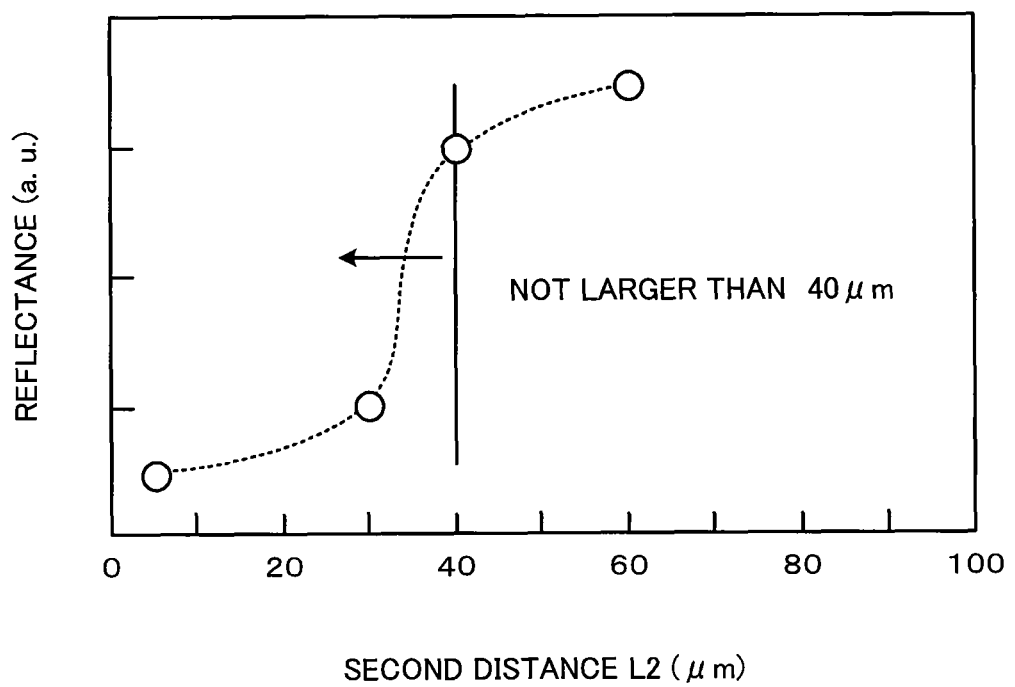
FIG. 8 is a chart showing the characteristic of the semiconductor light emitting device according to the embodiment.

FIG. 8 is a chart showing the relationship between the reflectance and the position where the lowermost first region 12 is formed. A second distance L2 mentioned in FIG. 8 refers to the distance between the second surface 11b and the lowermost first region 12. The above-mentioned reflectance is obtained by calculating the average reflectance of the lateral surfaces 11c at the time when light enters the lateral surfaces 11c of the sapphire substrate 11 from the MQW layer 23.

As shown in FIG. 8, the reflectance drops sharply at a point where the second distance L2 is approximately 40 µm. The lower portion of the lateral surface 11c of the sapphire substrate 11 is far from the MQW layer 23. Hence, the lower the position where the incident light enters, the larger the incident angle α. This means that the light emitting efficiency is improved by forming the roughened region in the lower portion rather than in the upper portion so that the reflectance can be reduced for the light with a large incident angle α.

Although it is necessary to take account of the thickness L0 of the sapphire substrate 11 and the necessary roughening rate, a larger improvement in the light emitting efficiency can be expected when the areas where the roughened surfaces are formed are concentrated in the lower portion of the lateral surface 11c of the sapphire substrate 11 as much as possible. Hence, it is preferable that the proportion (a/(a+b)) of the first width a to the second width b be made smaller in the portion near the first surface 11a and that the proportion (a/(a+b)) of the first width a to the second width b be made larger in the portion near the second surface 11a.

Figure 9:
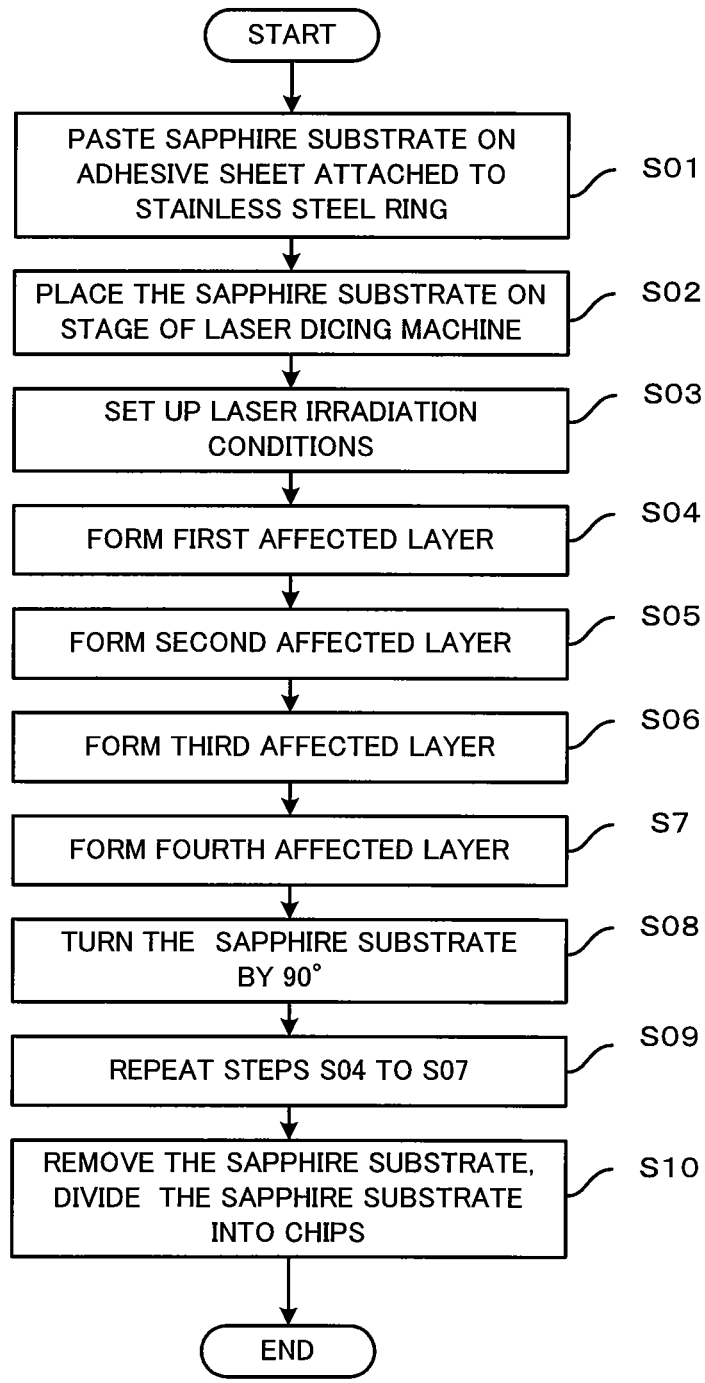
FIG. 9 is a flow chart showing main portions of the steps of manufacturing the semiconductor light emitting device according to the embodiment.
Figure 10A:
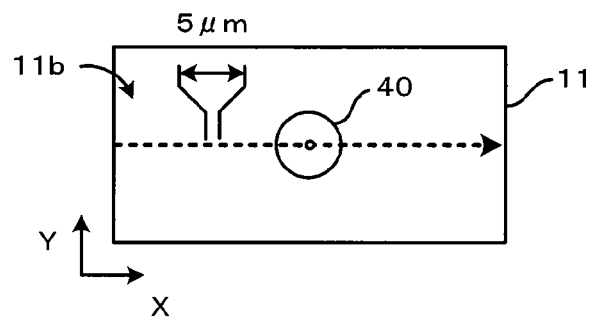
FIGS. 10A and 10B are cross-sectional views showing main portions of the steps of manufacturing the semiconductor light emitting device in sequential order according to the embodiment.
Figure 10B:
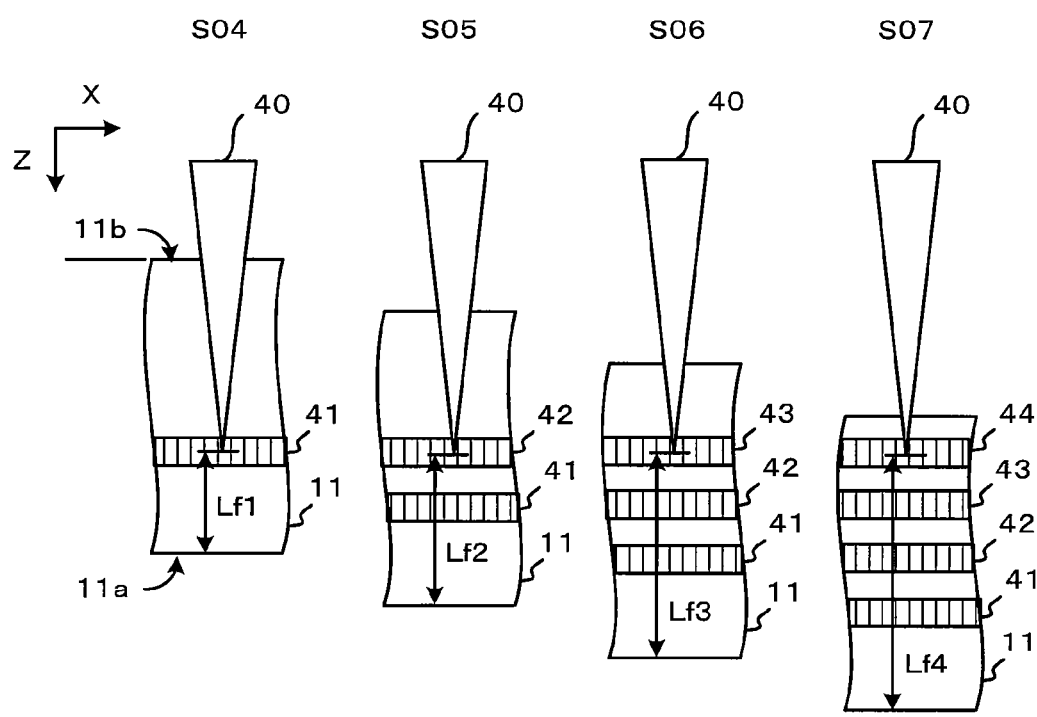

Next, a method of manufacturing the nitride semiconductor light emitting device 10 will be explained with reference to FIGS. 9 to 10B. FIG. 9 is a flowchart showing a main portion of the steps of manufacturing the nitride semiconductor light emitting device 10. FIGS. 10A and 10B are cross-sectional views showing a main portion of the steps of manufacturing the nitride semiconductor light emitting device 10.

Firstly, the nitride semiconductor laminated body 15 is formed on a sapphire substrate by a MOCVD (metal organic chemical vapor deposition) method.

The method of forming the nitride semiconductor laminated body 15 is briefly described below. As a preliminary treatment, the sapphire substrate with a C plane of a plane direction and a diameter of 150 mm is subjected to organic cleaning and acid cleaning, for example. The resultant sapphire substrate is contained in a reaction chamber of the MOCVD system.

Thereafter, the temperature of the sapphire substrate is raised to 1100° C., for example, by high-frequency heating in a normal-pressure atmosphere of a mixed gas of a nitrogen ($N_2$) gas and a hydrogen ($H_2$) gas. Thereby, the surface of the sapphire substrate is etched in gas phase, and a natural oxide film formed on the surface of the sapphire substrate is removed.

The N-type GaN layer 21 with a thickness of 3 µm is formed by using the mixed gas of the $N_2$ gas and the $H_2$ gas as a carrier gas while supplying an ammonium ($NH_3$) gas and a trimethyl gallium (TMG) gas, for example, as process gases, and supplying a silane ($SiH_4$) gas, for example, as the N-type dopant.

After the N-type GaN clad layer 22 with a thickness of 2 µm is formed in the similar manner, the temperature of the sapphire substrate is decreased to and kept at 800° C. which is lower than 1100° C., for example, while continuing supplying the $NH_3$ gas with the supply of the TMG gas and the $SiH_4$ gas stopped.

The GaN barrier layer with a thickness of 5 nm is formed by using the $N_2$ gas as the carrier gas while supplying the $NH_3$ gas, the TMG gas, for example, as the process gases. After that, the InGaN well layer with a thickness of 2.5 nm, in which the In composition ratio is 0.1, is formed by further supplying a trimethyl indium (TMI) gas, for example, as the process gas.

The forming of the GaN barrier layer and the forming of the InGaN well layer are alternately repeated 7 times, for example, while continuing or stopping the supply of the TMI gas. Thereby, the MQW layer 23 is obtained.

The undoped GaN cap layer with a thickness of 5 nm (not shown) is formed while continuing supplying the TMG gas and the $NH_3$ gas with the supply of the TMI gas stopped.

The temperature of the sapphire substrate is raised to and kept at 1030° C., for example, which is higher than 800° C., in the $N_2$ gas atmosphere while continuing supplying the $NH_3$ gas with the supply of the TMG gas stopped.

the P-type GaN clad layer 24 with a thickness of 100 nm, in which the concentration of Mg is approximately 1E20 $cm^{-3}$, is formed by using the mixed gas of the $N_2$ gas and the $H_2$ gas as the carrier gas while supplying: the $NH_3$ gas, the TMG gas as the process gases; and a bis(cyclopentadienyl) magnesium (Cp2Mg) gas as the P-type dopant.

The P-type GaN contact layer 25 with a thickness of approximately 10 nm, in which the concentration of Mg is approximately 1E21 $cm^{-3}$, is formed while supplying an increased amount of Cp2Mg.

The temperature of the sapphire substrate is lowered naturally with the supply of only the carrier gas continued while continuing supplying the $NH_3$ gas with the supply of the TMG gas stopped. The supplying of the $NH_3$ gas is continued until the temperature of the sapphire substrate reaches 500° C.

Thereby, the nitride semiconductor laminated body 15 is formed on the sapphire substrate and the P-type GaN contact layer 25 is located in the top surface.

An ITO (Indium tin oxide) film as a transparent conductive film 16 is formed on the P-type GaN contact layer 25 by a sputtering method, for example.

A portion of the transparent conductive film 16 is removed by a wet etching method using a mixed acid of nitric acid and hydrochloric acid so that a portion of the nitride semiconductor laminated body 15 is exposed.

The exposed portion of the nitride semiconductor laminated body 15 is anisotropically etching by a RIE (Reactive Ion Etching) method using a gas of chlorine system, so that a portion of the N-type GaN layer 21 is exposed.

The first electrode 17 is formed on the remaining portion of the transparent conductive film 16. The second electrode 18 is formed on the exposed portion of the N-type GaN layer 21.

The sapphire substrate thus obtained at this stage is one in which plural nitride semiconductor light emitting devices are arranged in a lattice shape.

Then, by following the procedure shown in FIG. 9, the sapphire substrate is divided into chips, and thereby individual nitride semiconductor light emitting devices are formed.

To begin with, the sapphire substrate is pasted on an adhesive sheet attached to a stainless ring with the nitride semiconductor laminate body 15 side facing the adhesive sheet (at step S01). Then, the sapphire substrate is placed on top of a stage of a laser dicing machine (at step S02).

The initial setup of the laser radiation conditions and the like is performed in the following manner, for example (at step S03). The laser to be used emits light with a wavelength of 1.06 μm. The output power of the laser is 300 mW. The pulse width of the laser light is in a range from 10 fs to 15 fs. The pulse recurrence frequency of the laser is 100 kHz. The process conditions include the feeding speed of 600 mm/s and the radiation intervals of 5 μm.

As shown in FIGS. 10A and 10B, the optical system to cast laser light 40 is made to focus on a depth Lf1, a 45-μm position from the first surface 11a, by adjusting the position in the Z direction. Then, laser light 40 is cast from the second surface 11b side of the sapphire substrate. Step scanning is performed at 5-μm intervals with a relative movement in the X directions between the optical system and the work (the sapphire substrate). Thus a first affected layer 41 is formed (at step S04).

Then in a similar manner to that described at step S04, the optical system is made to focus on a depth Lf2, an 85-μm position from the first surface 11a, and then a second affected layer 42 is formed (at step S05).

Then, the optical system is made to focus on a depth Lf3, a 125-μm position from the first surface 11a, and then a third affected layer 43 is formed (at step S06).

Then, the optical system is made to focus on a depth Lf4, a 165-μm position from the first surface 11a, and then a fourth affected layer 44 is formed (at step S07).

Then, the sapphire substrate is turned by 90° by turning the stage of the laser dicing machine (at step S08).

Then, in a similar manner to that described at steps S04 to S07, step scanning is performed at 5-μm intervals in the Y directions of the sapphire substrate, and thereby the first to fourth affected layers 41, 42, 43, 44 are formed (at step S09).

Then, the sapphire substrate is removed from the stainless ring, and then the sapphire substrate is divided into chips by breaking the sapphire substrate. Thus the nitride semiconductor light emitting devices 10 are obtained.

Note that after step S07, the processes performed at steps S04 to S07 are repeated by shifting the sapphire substrate in the Y directions. Every time the above-mentioned processes are repeated, the sapphire substrate is shifted over a distance corresponding to the size of each chip, e.g. 250 μm. Likewise, after step S09, the process performed at step S09 is repeated by shifting, in the X directions, the sapphire substrate over a distance corresponding to the size of each chip.

As has been described thus far, in the nitride semiconductor light emitting device 10 of the embodiment, the thickness L0 of the sapphire substrate 11 is made thicker. In addition, the four first regions 12 and the four second regions 13 are alternately formed from a position that is away from the first surface 11a by the first distance L1 towards the second surface 11b (the alternating structure can be observed in each lateral surface 11c). Each of the first regions 12 has the first roughness R1 and the first width a so that the roughening rate of each first region becomes not smaller than 0.5 but not larger than 0.85. Each of the second regions 13 has the second roughness R2 that is smaller than the first roughness R1 and also has the second width b that is smaller than the first width a.

Accordingly, the light extraction efficiency from the lateral surfaces 11C can be improved while the reliability can be secured. Consequently, the nitride semiconductor light emitting device that improves the light extraction efficiency from the lateral surfaces of the substrate can be obtained.

In the description given thus far, all the first regions 12 have the same first width a, whereas all the second regions 13 have the same second width b. However, similar effects to those obtained in the embodiment are obtainable as long as the first region 12 and the second region 13 included in the same set satisfy the relationship $0 < b \leq a/2$.

In addition, the substrate used in the above-described embodiment is a sapphire substrate, but other substrates such as a SiC substrate may be used instead.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor light emitting device comprising:
    a substrate including
        a first surface,
        a second surface opposite to the first surface,
        a plurality of lateral surfaces intersected with the first surface and the second surface,
        a plurality of first regions each provided on the lateral surfaces, and having a first width and a first roughness, and
        a plurality of second regions each provided on the lateral surfaces, and having a second width smaller than the first width and a second roughness smaller than the first roughness,
    the first regions and the second regions being alternately arranged, a proportion of the sum of the first widths to a distance between the first surface and the second surface being 0.5 or more; and
        a semiconductor laminated body provided above the first surface of the substrate, and including a first semiconductor layer of a first conductivity type, an active layer, and a second semiconductor layer of a second conductivity type which are stacked one upon another in this order.

2. The semiconductor light emitting device of claim 1, wherein
    the substrate is a sapphire substrate, and
    the semiconductor laminated body is a nitride semiconductor laminated body.

3. The semiconductor light emitting device of claim 1, wherein a proportion of the sum of the areas of the first regions to the area of the lateral surfaces is 0.85 or less.

4. The semiconductor light emitting device of claim 1, wherein a distance between the first surface and the second surface is 150 µm or more, and the first distance is 30 µm or more.

5. The semiconductor light emitting device of claim 1, wherein a distance between the second surface and the first region closest to the second surface is 40 µm or less.

6. The semiconductor light emitting device of claim 1, wherein the second width is larger than zero, and is half the first width or less.

7. The semiconductor light emitting device according to claim 6, wherein the first width is 30 µm, and the second width is 10 µm.

8. The semiconductor light emitting device of claim 1, wherein the first regions are formed with a constant repeating pitch.

9. The semiconductor light emitting device of claim 1, wherein a proportion of the first width to the second width on a first-surface side is smaller than a proportion of the first width to the second width on a second-surface side.

10. The semiconductor light emitting device of claim 1, wherein the first roughness of the first region is between a value equal to a wavelength of light emitted from the active layer and a value equal to one fifth of the wavelength.

11. The semiconductor light emitting device of claim 1, wherein each of the first and second regions extends in a direction parallel to the first surface from a first end of the lateral surface to a second end of the lateral surface.

12. The semiconductor light emitting device of claim 1, further comprising a transparent conductive film provided above the second semiconductor layer of the semiconductor laminated body, and having translucency to light emitted from the active layer.

13. The semiconductor light emitting device of claim 1, wherein the first and second regions are the exposed regions formed:

firstly by forming affected layers by focusing, into the substrate, a laser beam emitted from the second-surface side, and then relatively moving the laser beam in a discrete manner along a line where the substrate is to be divided; and then by breaking the substrate.

14. The semiconductor light emitting device of claim 13, wherein the laser beam is moved relatively in a discrete manner by a distance being longer than the diameter of the laser beam, and being not longer than twice the diameter of the laser beam.

15. A semiconductor light emitting device comprising:

a sapphire substrate including a first surface, a second surface opposite to the first surface, a plurality of lateral surfaces intersected with the first surface and the second surface, a plurality of first regions each provided on the lateral surfaces, and having a first width and a first roughness, and a plurality of second regions each provided on the lateral surfaces, and having a second width smaller than the first width and a second roughness smaller than the first roughness, the first regions and the second regions being alternately arranged, a proportion of the sum of the first widths to a distance between the first surface and the second surface being 0.5 or more; and a nitride semiconductor laminated body provided above the first surface of the sapphire substrate, and including a first nitride semiconductor layer of a first conductivity type, a nitride active layer, and a second nitride semiconductor layer of a second conductivity type which are stacked one upon another in this order.

16. The semiconductor light emitting device of claim 15, wherein a proportion of the sum of the areas of the first regions to the area of the lateral surfaces is 0.85 or less.

17. The semiconductor light emitting device of claim 15, wherein a distance between the first surface and the second surface is 150 µm or more, and the first distance is 30 µm or more.

18. The semiconductor light emitting device of claim 15, wherein a distance between the second surface and the first region closest to the second surface is 40 µm or less.

19. The semiconductor light emitting device of claim 15, wherein the second width is larger than zero, and is half the first width or less.

20. The semiconductor light emitting device of claim 15, wherein a proportion of the first width to the second width on a first-surface side is smaller than a proportion of the first width to the second width on a second-surface side.

* * * * *